US009250399B2

(12) United States Patent
Margolin et al.

(10) Patent No.: US 9,250,399 B2
(45) Date of Patent: Feb. 2, 2016

(54) HIGH DENSITY ACTIVE MODULAR OPTOELECTRONIC DEVICE FOR USE WITH PUSH-RELEASE MECHANISM AND METHOD FOR USING SAME

(75) Inventors: Mark Margolin, Highland Park, IL (US); Anthony L. Moretti, St. Charles, IL (US); Gregory Bunin, Lake Zurich, IL (US); Ilya Makhlin, Wheeling, IL (US)

(73) Assignee: OPTOGIG, INC., Northbrook, IL (US)

( * ) Notice: Subject to any disclaimer, the term of this patent is extended or adjusted under 35 U.S.C. 154(b) by 0 days.

(21) Appl. No.: 12/239,420

(22) Filed: Sep. 26, 2008

(65) Prior Publication Data

US 2009/0297159 A1       Dec. 3, 2009

Related U.S. Application Data

(63) Continuation-in-part of application No. 11/513,577, filed on Aug. 31, 2006, now abandoned, and a continuation-in-part of application No. 11/955,119, filed on Dec. 12, 2007, now abandoned.

(51) Int. Cl.
*G02B 6/42* (2006.01)
*H05K 9/00* (2006.01)

(52) U.S. Cl.
CPC .............. *G02B 6/4201* (2013.01); *G02B 6/423* (2013.01); *G02B 6/4292* (2013.01); *H05K 9/0058* (2013.01); *G02B 6/4202* (2013.01)

(58) Field of Classification Search
None
See application file for complete search history.

(56) References Cited

U.S. PATENT DOCUMENTS

| | | | |
|---|---|---|---|
| 4,185,883 A | 1/1980 | Chown et al. | |
| 4,826,272 A | 5/1989 | Pimpinella | |
| 5,073,046 A | 12/1991 | Edwards et al. | |
| 5,386,488 A * | 1/1995 | Oikawa | 385/92 |
| 5,625,733 A * | 4/1997 | Frigo et al. | 385/88 |
| 5,631,988 A * | 5/1997 | Swirhun et al. | 385/89 |
| 5,815,623 A * | 9/1998 | Gilliland et al. | 385/93 |
| 5,841,562 A | 11/1998 | Rangwala et al. | |
| 5,852,696 A | 12/1998 | Collins et al. | |
| 6,114,221 A * | 9/2000 | Tonti et al. | 438/455 |
| 6,234,687 B1 * | 5/2001 | Hall et al. | 385/88 |

(Continued)

OTHER PUBLICATIONS

"Gaugeable Tube Fittings and Adapter Fittings", www.swagelok.com, Sep. 2011, pp. 1-66.*

(Continued)

*Primary Examiner* — Michelle R Connelly
(74) *Attorney, Agent, or Firm* — Patzik, Frank & Samotny Ltd.

(57) ABSTRACT

Super miniature TFF and TFP active modular optoelectronic components are based on an optical interface that is three times less than the size of SFF/SFP components and about six times smaller than an SC based component and thus provides a density that is three times higher than LC interfaces. The invention provides substantially smaller photonic devices that can be used with substantially smaller optoelectronic components and combines the new optoelectronic components with the new smaller miniature interconnect systems such as the Push-Release type using the same interface. The new interface can be used with sub-millimeter or larger diameter ferrules. Photonic devices are mounted in a close proximity of the active end of a fiber stub thereby avoiding the need for lenses and active alignment and enabling use in active hermetic or non-hermetic subassemblies.

11 Claims, 16 Drawing Sheets

(56) References Cited

U.S. PATENT DOCUMENTS

| | | | |
|---|---|---|---|
| 6,450,704 B1* | 9/2002 | O'Connor et al. | 385/92 |
| 6,526,205 B1* | 2/2003 | Wilson et al. | 385/52 |
| 6,757,308 B1* | 6/2004 | Eldring et al. | 372/36 |
| 6,833,999 B2* | 12/2004 | Go | 361/813 |
| 6,840,685 B1* | 1/2005 | Kuba | 385/88 |
| 7,226,218 B2 | 6/2007 | Wang et al. | |
| 7,261,472 B2* | 8/2007 | Suzuki et al. | 385/75 |
| 7,284,912 B2* | 10/2007 | Suzuki et al. | 385/75 |
| 7,303,340 B2 | 12/2007 | Hubner | |
| 7,350,983 B2* | 4/2008 | Saitoh et al. | 385/88 |
| 2001/0010743 A1* | 8/2001 | Cayrefourcq et al. | 385/88 |
| 2002/0031313 A1 | 3/2002 | Williams | |
| 2002/0126964 A1* | 9/2002 | Blom et al. | 385/88 |
| 2003/0053766 A1 | 3/2003 | Cheng et al. | |
| 2003/0068138 A1 | 4/2003 | Jack et al. | |
| 2003/0095753 A1 | 5/2003 | Wada et al. | |
| 2003/0103733 A1 | 6/2003 | Fleenor et al. | |
| 2003/0113071 A1 | 6/2003 | Kim et al. | |
| 2003/0118283 A1 | 6/2003 | Healy | |
| 2003/0138219 A1* | 7/2003 | O'Toole et al. | 385/92 |
| 2003/0169976 A1* | 9/2003 | Snyder | 385/88 |
| 2003/0180012 A1 | 9/2003 | Deane et al. | |
| 2004/0208457 A1* | 10/2004 | Cheng et al. | 385/80 |
| 2004/0228584 A1* | 11/2004 | Dudek et al. | 385/89 |
| 2004/0252951 A1* | 12/2004 | Nagasaka et al. | 385/88 |
| 2005/0053336 A1 | 3/2005 | Ito et al. | |
| 2005/0185900 A1 | 8/2005 | Farr | |
| 2005/0201695 A1* | 9/2005 | Farr | 385/94 |
| 2005/0226571 A1* | 10/2005 | Malagrino et al. | 385/92 |
| 2006/0002661 A1 | 1/2006 | Pizzarulli | |
| 2006/0051029 A1* | 3/2006 | Aizpuru et al. | 385/88 |
| 2007/0065086 A1 | 3/2007 | Wyatt | |
| 2007/0081770 A1* | 4/2007 | Fisher | 385/92 |
| 2007/0147744 A1* | 6/2007 | Dunn et al. | 385/88 |
| 2007/0217734 A1 | 9/2007 | Auburger | |

OTHER PUBLICATIONS

Trademark Electronic Search System (TESS), Swagelok Ferrule-Pak, 2 pages, Aug. 2013.*

European Patent Office, Supplemental Search Report issued in connection with corresponding European Patent Application No. EP09816800, dated Aug. 8, 2013.

* cited by examiner

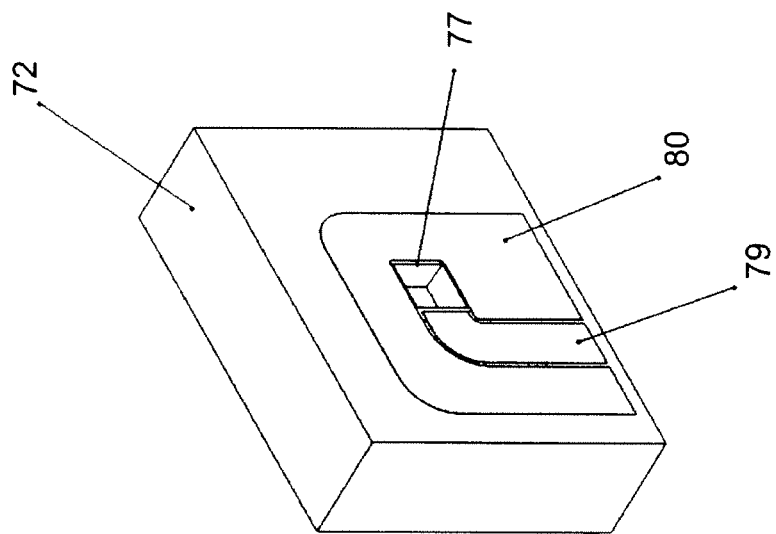
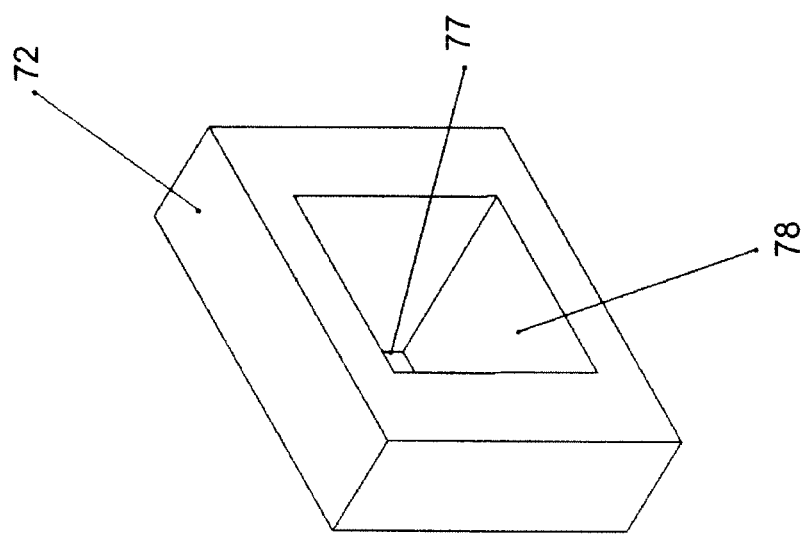
FIG. 6D

HIGH DENSITY ACTIVE MODULAR OPTOELECTRONIC DEVICE FOR USE WITH PUSH-RELEASE MECHANISM AND METHOD FOR USING SAME

This application is a Continuation-In-Part of both: (1) pending application Ser. No. 11/513,577 filed on Aug. 31, 2006 entitled Active Modular Optoelectronic Components; and, (2) pending application Ser. No. 11/955,119 filed on Dec. 12, 2007 entitled Active Modular Optoelectronic Components, which in turn is a CIP of the '577 application.

BACKGROUND OF THE INVENTION

1. The Field of the Invention

The invention relates to the field of communication along a fiber optic channel. More specifically, the invention relates to active fiber optic components or photonic devices such as transceivers, transmitters and receivers that can be used with sub-millimeter diameter interconnect systems.

2. The Relevant Technology

Fiber optic transceiver modules, also known as optoelectronic transceivers, transmit and receive data by the means of optical signals. Such transceivers provide for the bi-directional communication of signals between an electrical interface and an optical interface. A fiber optic transceiver includes a circuit board that contains at least a receiver circuit, a transmitter circuit, a power connection and a ground connection.

Transceivers and other active fiber optic modules are miniaturized in order to increase the port density associated with the network connection with respect to switches, routers, cabling patch panels, wiring closets, computer I/O and the like. Form factors for miniaturized optical modules such as Small Form Factor Pluggable ("SFP") that specifies an enclosure about 9.05 mm in height above the PC board by about 13.2 mm in width and having a minimum of 20 electrical input/output connections. In order to maximize the available number of optical transceivers per area, multiple transceiver modules are arranged in rows and columns. Each SFP transceiver module or other active photonic module is plugged into a socket or receptacle.

As the need for bandwidth has increased, high speed optical transceivers have been developed to satisfy this need. The primary markets for this demand for increased bandwidth has been both the local area network (LAN) and the storage area network (SAN) markets. The predominant LAN standard is Ethernet, while the predominant SAN standard is Fibre Channel. Transceivers from speeds of 155 Mb/s up to 10 Gb/s have been introduced that meet these requirements and it is expected that even higher speeds will soon be required.

The initial transceivers were based on 1×9 modules (shown on FIG. 2A) which were soldered onto a host printed circuit board ("PCB") and utilized duplex SC optical connectors. The need for reconfigurability led to the development of the first hot-pluggable transceivers, known as GBIC (Gigabit Interface Converter), having a footprint on the front panel of a host system that is similar to the 1×9 module, which could be plugged into a powered circuit board in a router, switch, or other such piece of equipment (thus, the term "hot-pluggable.")

Arrays of these modules could be placed on the edge of a circuit board such that the SC outputs were presented at the output of a switch or router. The dual SC port arrangement limited the minimum size of the ports that could be stacked together. The ferrule of the SC connector is 2.5 mm in diameter. The center-to-center spacing of the dual SC port is 12.7 mm, and the width of the dual SC port is 26 mm. The height is 9.4 mm above the PC board surface.

Shortly thereafter, the need to increase the density of optical ports resulted in the introduction of both the Small Form Factor soldered (SFF) and Small Form Factor pluggable (SFP) transceivers. The SFF and SFP transceivers reduced the size of the modules in half in the horizontal direction by replacing the optical interface with duplex LC connectors, which are half the size of SC connectors, as shown in FIG. 2B. The ferrule of the LC connector is 1.25 mm in diameter. The center-to-center spacing of the duplex LC port is 6.1 mm, and the width of the dual LC port is 13.2 mm. The height of the dual LC port is 9.05 mm above the PC board surface.

The large success of fiber optic networks based on these described active fiber optic transceivers has increased the demand for even higher port density that can only be met by transceivers and other active components that are even smaller than those currently available. Until now, no known optical interface has been able to successfully address this need for transceivers of smaller size. In such high density applications, the components are too small to connect and disconnect with one's fingers. The present invention solves that problem with its new transceiver, as shown in FIG. 1, which is based on a new fiber optic interface which is about 3 times smaller than the standard SFF/SFP form factor, as shown on FIG. 2C. In turn this interface is built around the ferrule with diameter substantially less than 1.25 mm.

To convert electronic data to optical data for transmission through a fiber optic cable, a transmitter optical subassembly ("TOSA") is typically used. A driver integrated circuit converts electronic data to drive a laser diode or an LED in a TOSA to generate the optical signal or data.

To convert optical data to electronic data, a receiver optical subassembly ("ROSA") is typically used. The ROSA typically includes a photo diode that, in conjunction with other circuitry converts the optical data to electronic data. To communicate through fiber optic cables, usually both a TOSA and a ROSA are needed. Combining both a TOSA and a ROSA into a single assembly along with electronic devices and circuits, results in a transceiver. Typical transceiver designs combining discrete TOSAs and ROSAs cannot have their footprint further reduced in size because of the standard LC connector interface. Further, even if a smaller optical connector interface were available, TOSAs and ROSAs using standard packaging technology would not be able to be substantially reduced in size because smaller transistor outline (TO) packages which contain the optoelectronic die (lasers and photo detectors) are not available. It is difficult to reduce the size of these TO cans further as the glass feed throughs for the electrical leads cannot be further reduced in size.

Accordingly, there is a need for super miniature active fiber optic modules designed for high density applications especially in data and telecommunication electronic equipment. Generally, three major technical challenges in achieving this goal are: (1) providing substantially smaller passive interconnect systems that provide the needed functionality, (2) developing the substantially smaller active fiber optic modules that provide the necessary function, and, (3) achieving compatibility of the new active modules with the new passive interconnect system.

SUMMARY OF THE INVENTION

The present invention includes super miniature optical transceivers and other photonic modules such as transmitters and receivers for industrial applications. The industrial applications include: telecommunications; data communications; data storage; gigabit/sec and higher speed Ethernet and Fiber Channel.

The three major technical challenges mentioned above were overcome in the following way: (1) a substantially smaller passive push-release interconnect system that utilizes ferrules having sub-millimeter diameters, was developed of the type presented in pending application Ser. No. 11/837,997 filed Aug. 13, 2007 by Illum Technologies, Inc. of Northbrook, Ill. entitled High Density Fiber Interconnect System with Push-Release Mechanism and Method for Using Same, (2) substantially smaller high density active fiber optic modules were developed and presented in this invention; and, (3) the new smallest known active optical modules providing the necessary functionality were developed with exactly the same interface as the new passive interconnect system. This module is based on the unique super miniature photonic subassembly Ferrule-Pak comprising an important part of the present invention.

With the architecture of the present invention, the fiber can be placed in very close proximity with the active area of the photonic device, thereby avoiding the need for a lens interposed therebetween. Expensive active alignment can thus be avoided. Because there is a small gap between the fiber and the photonic device, a thin gel may be used in non-hermetic applications to protect the devices from damage caused by moisture.

The Ferrule-Pak of the present invention has two embodiments. One of them comprises a fiber stub, a silicon (or other material with appropriate dielectric constant) board, and a photonic device mounted on it. The stub and board are aligned to each other by the chamfer on the stub which acts as an alignment cone and the etched pyramidal hole in the silicon board or the hole chamfer on the board made of non-crystalline material. Photonic devices such as a VCSEL (Vertical Cavity Surface Emitting Laser) or detector can be mounted directly on the board contacts in a flip-chip fashion (semiconductor mounting technique well known in the art). This configuration allows very precise passive alignment of the fiber stub to the silicon board consequently avoiding expensive active alignment. Another embodiment comprises a fiber stub, a ceramic holder designed to act as an RF coaxial conductor, and a photonic device mounted on that holder. This second embodiment also has a version where the described elements are placed inside of the two semi-cylindrical metal shells soldered or welded to each other and to ceramic parts to achieve hermeticity.

Among the advantages of the present invention are its super miniature size which is approximately three times smaller than existing active fiber optic modules while providing the needed functionality. The Ferrule-Pak can be used with different coatings on the fiber area such as: anti-reflective, absorptive, mirror, filters, and the like. There is no need for lenses interposed between the photonic devices and the fiber. The Ferrule-Pak can be used in hermetic, non-hermetic or quasi-hermetic subassemblies.

With the present invention, there is sufficient accuracy provided such that flip-chip processes can be used to allow passive alignment of the fiber and active components, so as to avoid often complicated and expensive active alignment wherein the active components (laser and detector) need to be powered and then moved relative to the fiber to achieve an optimum level of electrical output.

The present invention provides for versions comprising: non-hermetic, quasi-hermetic, and fully hermetic barriers surrounding the delicate photonic devices depending on the specifications.

The present invention further provides the smallest known package for photonic devices in functional combination with a fiber optic interconnect system. Currently, the smallest known such package is based on a TO can measuring 3.6-3.8 mm in diameter. The new interface of the current invention with the 0.8 mm diameter ferrule has a three times higher density than a typical LC type connector (See FIG. 2B for SFP versus TFP of the current invention shown on FIG. 2C). The new super miniature form factor optical modules of the present invention are designated as the Tiny Form Factor Pluggable (TFP) and Tiny Form Factor soldered (TFF).

Active fiber optic modules of the present invention can be either hot-pluggable to the electrical connector on the host PCB (TFP) or soldered (TFF) to the host PCB. In addition, the super miniature form factors of the present invention provide for higher densities of fiber optic components than is currently achieved. Moreover, the active subassemblies can be provided in single or duplex forms. Hence, six transmitter modules, six receiver modules or a combination thereof can occupy the same footprint as one SFP module.

Moreover, the Ferrule-Pak active subassemblies of the present invention can be either optical transmitters or optical receivers that are sized to be interchangeable and thereby provide modularity within their respective component housings. Hence the same active subassemblies can be interchanged with the subassemblies of other component housings as needed.

The Ferrule-Pak concept of the present invention includes active optical and electrical components being attached in close proximity to a fiber optic ferrule. The Ferrule-Pak can be attached to a printed circuit board ("PCB") in different ways which depends on the embodiment. In that way, electrical, mechanical, and thermal connections are simultaneously provided to the PCB.

The Ferrule-Pak presented in this invention has two major embodiments: one with the photonic device mounted on the specially formed silicon board and a second one with the photonic device mounted on the ceramic holder containing the RF conductor inside. In a first embodiment of the present invention, an active modular optoelectronic interface includes: a transmitter module; a receiver module or a combination thereof; and, a super miniature form factor. The interface comprises the device having a sub-millimeter diameter ferrule; and, the interface having a three times higher density than a typical LC-type connector. The interface further comprises six modules occupying the same footprint as one SFP module.

An active modular optoelectronic device for use with a push-release mechanism comprises: a half adapter having a first end; a connector operably received at the first end of the half adapter; the half adapter further having a push-release mechanism interposed between the half adapter and the connector for operably connecting and releasing the connector from the half-adapter; an alignment sleeve holder operably connected to the half adapter at a second end of the half adapter. A printed circuit board is operably associated with the alignment sleeve holder at the opposite end thereof. At least one Ferrule-Pak holder is operably connected to the printed circuit board. At least one Ferrule-Pak is operably connected to the Ferrule-Pak holder. The above-identified active modular optoelectronic device can be combined with other types of mechanical interfaces and not depart from the scope of the invention.

The Ferrule-Pak of the present invention comprises: a fiber stub; a silicon board operably connected to a first end of the fiber stub; an optical fiber spanning the longitudinal interior of the fiber stub from one end to the opposite end thereof; and, a photonic device operably connected to the silicon board. The silicon board is connected to the second end of the fiber stub; and, an alignment mechanism is provided on the fiber stub and the silicon board for aligning the photonic device to the optical fiber.

The optoelectronic device further comprises an alignment mechanism comprising the silicon board having a substantially pyramid shaped opening etched therein; and an alignment cone manufactured onto one end of the fiber stub for receipt by the pyramid shaped opening in the silicon board. The optoelectronic device can alternatively further comprise the alignment means comprising the ceramic board having a substantially conically shaped opening etched therein; and, an alignment cone manufactured onto one end of the fiber stub.

The optoelectronic device farther comprises at least one electrical trace placed on said silicon board; and, the silicon board having an aperture passing therethrough. The optoelectronic device can alternatively further comprise a ceramic board; at least one electrical trace placed on said ceramic board; and, the ceramic board having an aperture passing therethrough. At least one electrical trace is placed on the printed circuit Board. The Ferrule-Pak holder securely holds at least one Ferrule Pak and operably electrically connects the Ferrule-Pak to the trace on the printed circuit board; and, the printed circuit board having at least one alignment hole formed therein for receipt of at least one alignment pin on the Ferrule-Pak holder.

In a second embodiment, the Ferrule-Pak comprises a metalized ceramic holder; an RF conductor designed for specific impedance operably carried by the holder; a photonic device operably connected to said holder; and, a fiber stub. The Ferrule-Pak holder further comprises a V-groove holding the Ferrule-Pak; at least one location pin; and, the printed circuit board having at least one hole receiving said location pin. The Ferrule-Pak further comprises a metalized area for soldering; a pair of semi-cylindrical metal shells; and a soldering area.

These and other features of the present invention will become more fully apparent from the following description and appended claims, or may be learned by the practice of the invention as set forth hereinafter.

BRIEF DESCRIPTION OF THE DRAWINGS

The appended drawings contain figures of illustration and various embodiments of the present invention. The features of the invention mentioned herein, as well as other features will be described in connection with the embodiments. However, the illustrated embodiments are only intended for illustrative purposes and not to limit the invention. The drawings contain the following figures:

FIG. 6D shows a front and rear view of the specially formed silicon board.

DETAILED DESCRIPTION OF THE DRAWINGS

Reference will now be made to other aspects of the drawings, to describe the invention. It is to be understood that the drawings are diagrammatic and schematic representations of certain embodiments and are not limiting of the present invention, nor are they necessarily drawn to scale.

Figure 1:
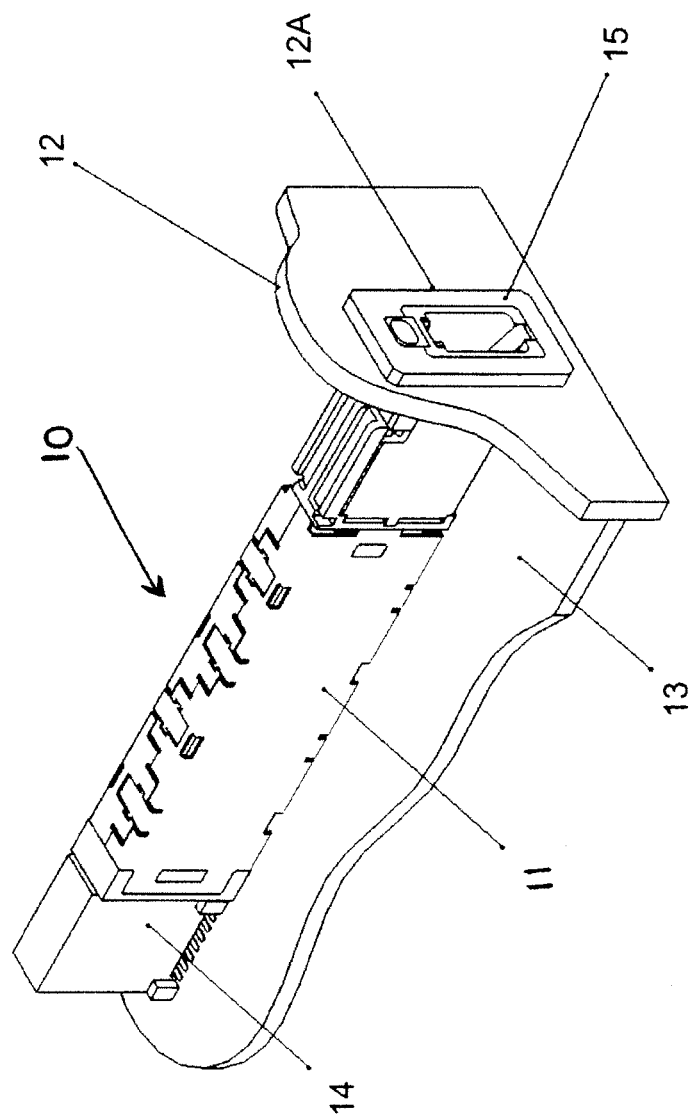
FIG. 1 shows a TFP transceiver general application in the electronic device.

A high density super miniature optoelectronic device 10 is shown in FIG. 1. Duplex optoelectronic unit 11 can be a transceiver, transmitter or receiver depending upon the active components contained inside of it. For example, if duplex unit 11 contains both a transmitter and a receiver as its two active components, then it would be a transceiver. The optoelectronic device 10 of the present invention also can be designed in a simplex configuration with the same basic features (not shown). In that case, the unit can be either transmitter or receiver only. The unit shown is utilized in the electronic chassis as mounted on the front panel 12 and mother board 13, and connected to electrical connector 14. The opening 12A on the front panel 12 is covered with the flange 15 which also can serve as a grounding element if required.

Figure 2:
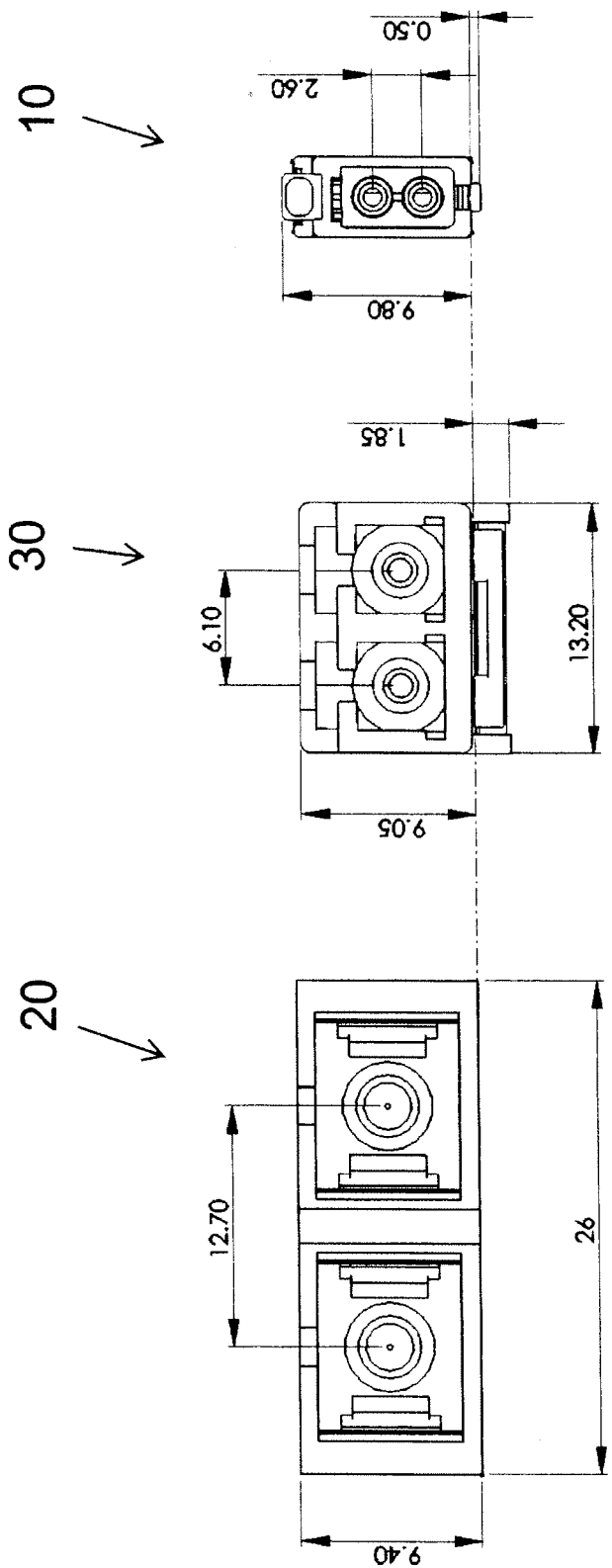
FIGS. 2 (A, B, and C) shows a dimensional comparison of TFP transceiver with the existing devices of the same application.

The footprint of a module is defined as the height versus the width of the module. FIGS. 2A, 2B, and 2C show a comparison of the footprints between 1×9 module, SFP module, and TFP module respectively. Shown in FIG. 2C is a single duplex module TFF-TFP 10 having a footprint of only 4.2 mm wide by 9.8 mm high. The ferrule center to center vertical distance of duplex module 10 is only 2.6 mm. The total width of three duplex modules mounted in side-by-side configuration is only 12.6 mm which is smaller than existing SFF-SFP modules 30, shown in FIG. 2B. That enables use of six channels of TFP or TFF 10 of FIG. 2C versus two channels of SFP or SFF 30 of FIG. 2B respectively in the same footprint.

Duplex active device 10 of FIG. 1 with internal push-release mechanism and internal shutter of the type described herein (as well as in co-pending U.S. patent application Ser. No. 11/837,997, of Ilium Technologies, Inc. filed Aug. 13, 2007 and entitled "High Density Fiber Optic Interconnect System With Push-Release Mechanism and Method for Using Same") has the substantially same mechanical interface with the above-mentioned system which is shown on FIG. 3. Two connectors 31 and 34 are coupled in the adapter 32. Adapter 32 consists of two identical universal halves 33. Each of those halves has both a push-release mechanism and an internal shutter (see FIG. 5A). The Push-Release mechanism is controlled by the connector's internal spring and works automatically when miniature connectors are connected or disconnected to or from the interior of the adapter. Pushing connectors into adapter until stoppers 37 and 38 click into the adapter latches 59 of FIG. 5A connects the connectors to the adapter. Pushing the tab 35, 36, serves to disconnect the connector 31, 34 from the adapter 32.

Figure 4:
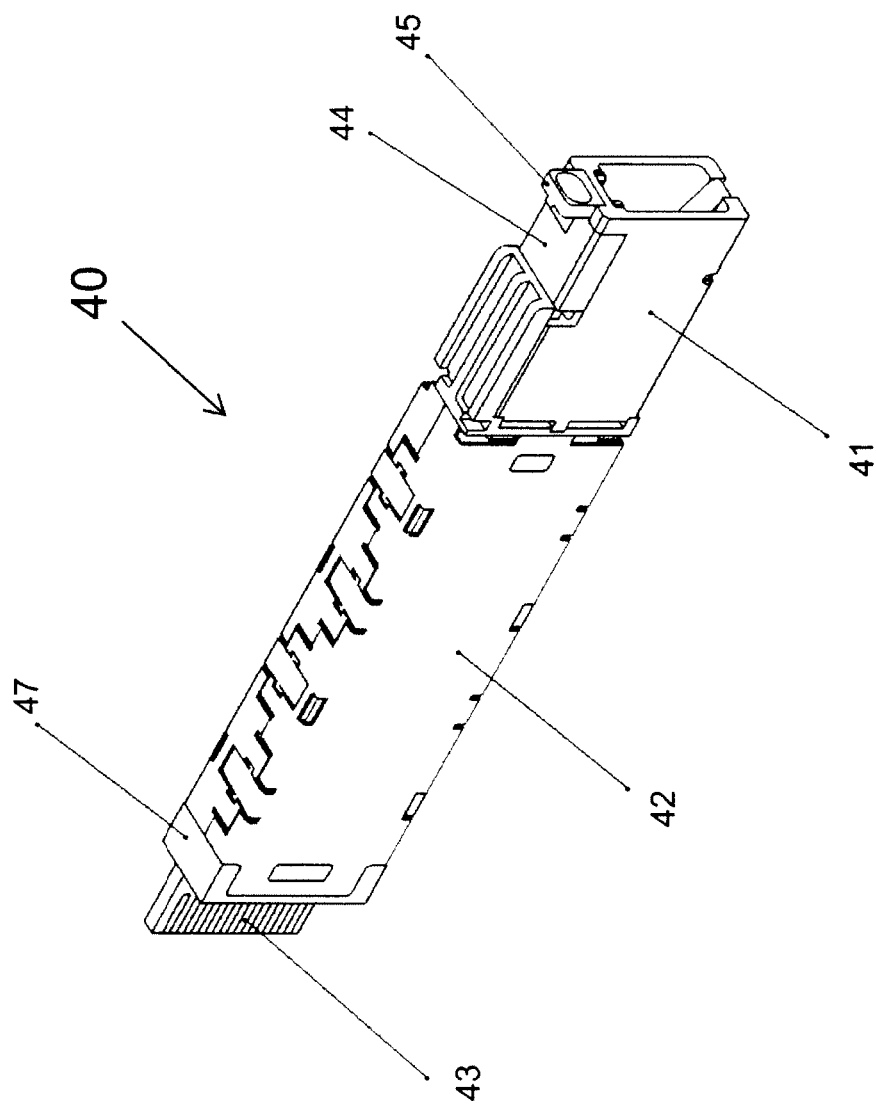
FIG. 4 is a general view of the TFP duplex transceiver of the present invention with push-release mechanism and internal shutter.

There are two versions of the active optoelectronic module of the present invention: either hot pluggable 40 as shown in FIG. 4 or soldered to the host PC board (not shown). The hot pluggable module 40 consists of three major subassemblies operably connected to each other. They are a universal half adapter 41 with its push release mechanism 44 and automatic shutter mechanism (shown on FIG. 5A), two metal shields 42 which serve as an EMI (electromagnetic interference) shield for the electronics within the PC board 43. The exploded view of that active optoelectronic module is shown in FIG. 5.

Figure 3:
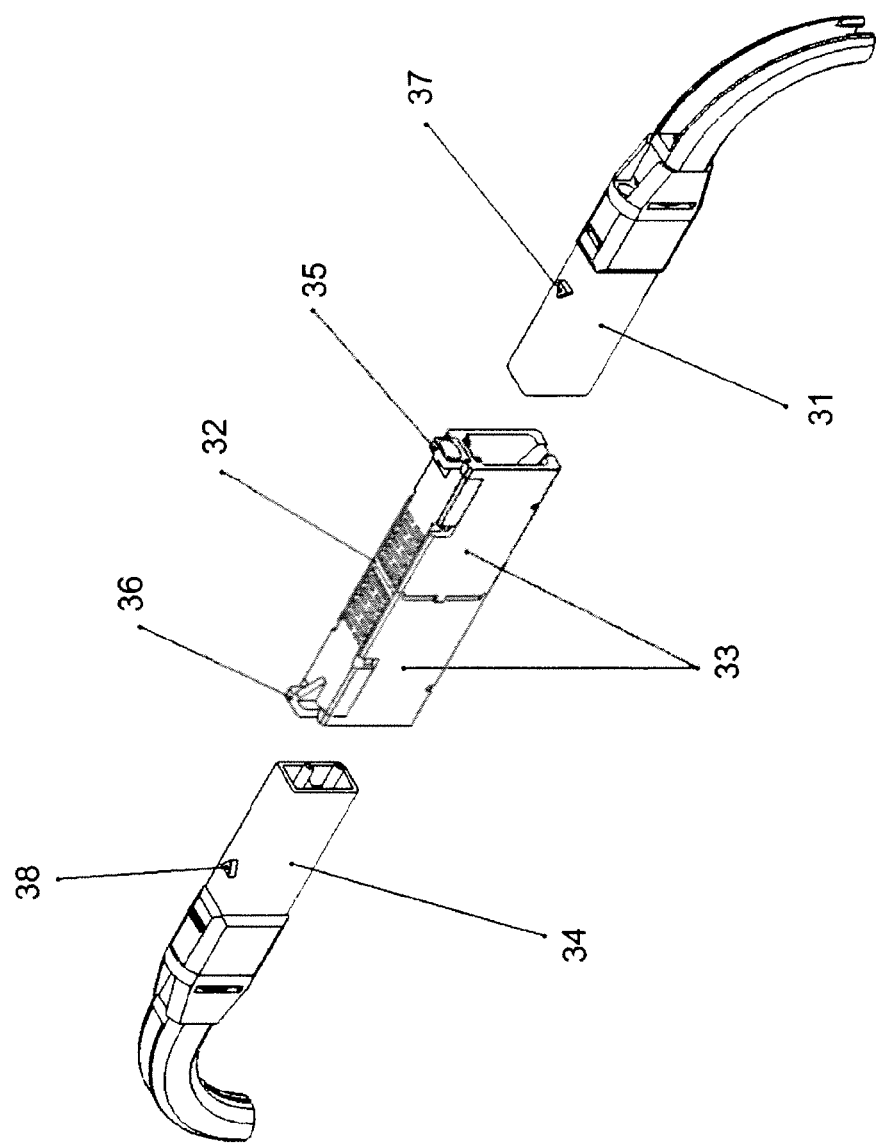
FIG. 3 is view of passive duplex components compatible with TFP transceiver.
Figure 5:
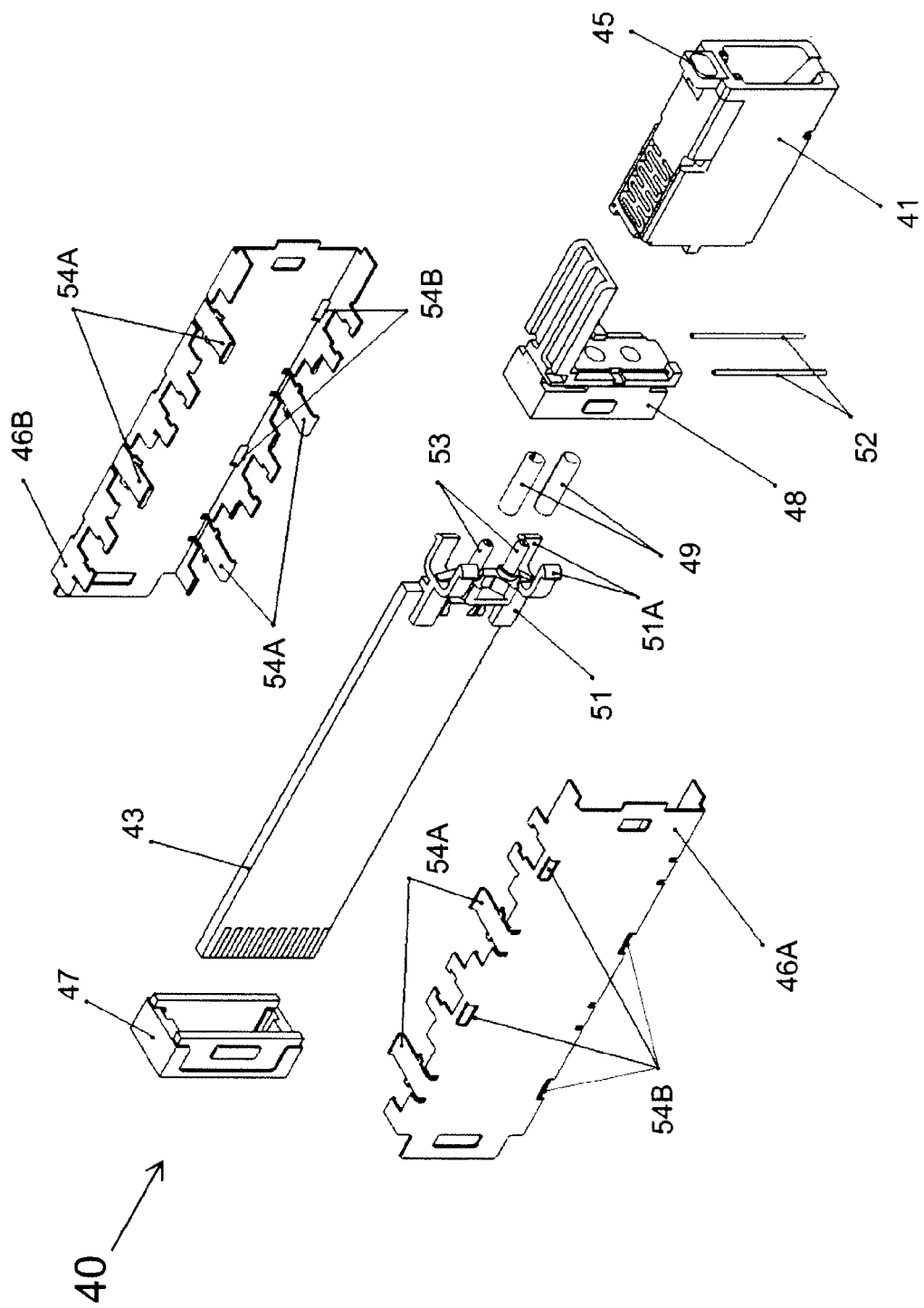
FIG. 5 is an exploded view of the TFP duplex transceiver of the present invention.

With reference to FIG. 5 universal half adapter 41 is an identical subassembly to the half 33 of the passive adapter 32 shown in FIG. 3. This half adapter 41 of FIG. 5 is connected to the alignment sleeves holder 48 by two pins 52 that are the same as the ones used to connect universal half adapters 33 shown on FIG. 3. Pins 52 goes through the appropriate holes in hinge type bosses on adapter 41 and holder 48 and connect these two parts tightly together. Alignment sleeves holder 48 of FIG. 5 holds in place two alignment sleeves 49 which are mounted on the ceramic fiber stubs of the Ferrule-Paks 53 located on the Ferrule-Pak holder 51. Ferrule-Pak holder 51 is mounted on the PC board 43 and facilitates electrical connection of the Ferrule-Pak 53 to it (see FIG. 6A). As shown in FIG. 5, Ferrule-Pak holder 51 also has two pairs of latches 51A which mechanically connect PC board 43 to the alignment sleeves holder 48 which also serves as a connecting element to connect PC board 43 and adapter half 41. PC board 43 is attached mechanically and connected electrically to two EMI metal shells 46A, 46B. Metal shells 46A, 46B are identical parts which are designed in such a way that they can snap together and to the PC board 43 by the way of multiple latches 54A and corresponding slots 54B on their bodies. At the back end of the structure there is a rear support 47 made from electrically non-conductive material which supports the PC board 43 especially during the plug-in process. The rear support 47 also partially protects the interior of the optoelectronic module 40 from dust.

Figure 5A:
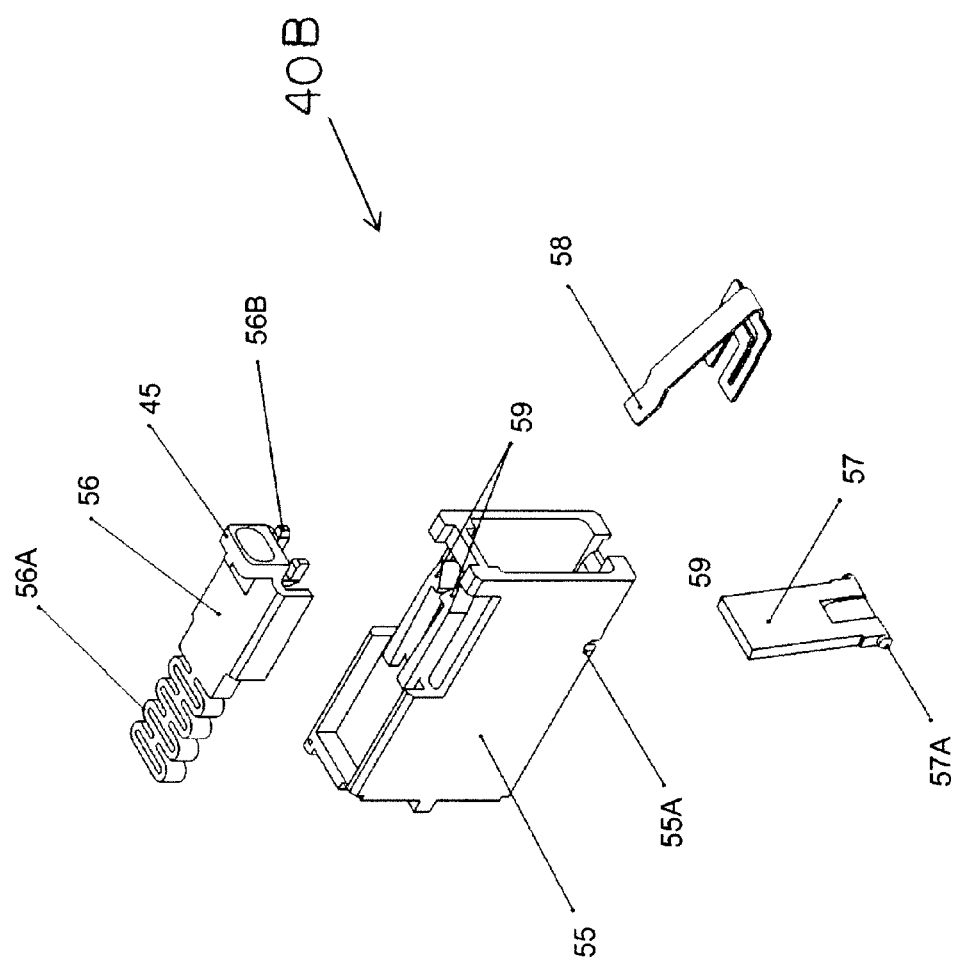
FIG. 5A is an exploded view of the universal half adapter identical for both active and passive devices.

FIG. 5A shows exploded view of half adapter 41 of FIG. 5. Half adapter 41 includes spring loaded shutter 57 which protects the user's eyes from the laser emissions and partially protects the interior of half adapter 41 from dust, dirt, and particles. Half adapter 41 further includes releaser 56 having resilient portion 56A and release tab 45.

Pushing release tab 45 in a direction away from the user with a stylus like object results in movement of releaser 56 and compression of resilient portion 56A. Double wedge 56B on the underside of releaser 56 is then driven between internal latches 59 of half adapter 41. In the preferred embodiment they are provided as a molded element of the housing 55 itself. Because of their wedge shape, the internal latches 59 are separated enough so that they no longer hold stopper 37 of connector 31 (shown on FIG. 3) in captured fashion therebetween. As a result of this release and by the force of the internal connector spring, the connector 31 is urged to slide outwardly relative to half adapter 41 towards the user.

Shutter spring 58, which in this embodiment is a leaf spring bias shutter 57 closed unless and until a connector 31 is inserted into half adapter 41. Shutter 57 has two half pins 57A and secured by them into two semicircular openings 55A in housing 55. In that way, leaf spring 58 keeps shutter 57 in place by slight pressure. As a result, the shutter 57 open upon insertion of the connector 31 and close upon withdrawal of the connector 31, as a result of biasing from the leaf spring 58. While stopper 37 (shown on FIG. 3) and ends of latches 59 are shown as triangular in shape, other configurations of stoppers or latches that serve to capture and retain a component in releasable fashion should be considered as being within the scope of the invention.

Figure 6:
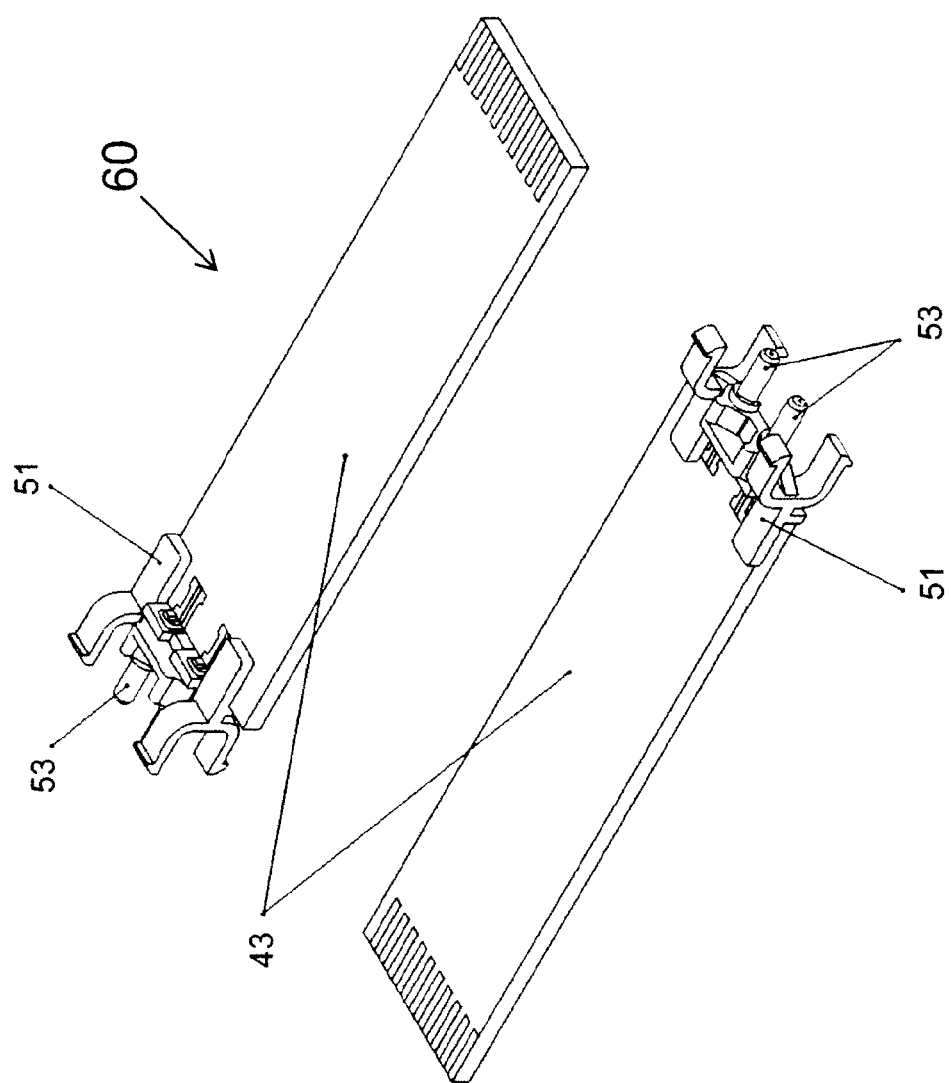
FIG. 6 shows front and rear view of the optoelectronic assembly embodiment with the Ferrule-Pak utilizing silicon board.

FIG. 6 shows a PC board subassembly 43 with the Ferrule-Pak holder 51 attached to it mechanically and connected electrically. The Ferrule-Pak holder 51 contains two Ferrule-Paks 53. Ferrule-Paks 53 can be both: transmitters such as VCSELs or other lasers; receivers such as detectors or a combination of each, so as to form a transceiver.

Figure 6A:
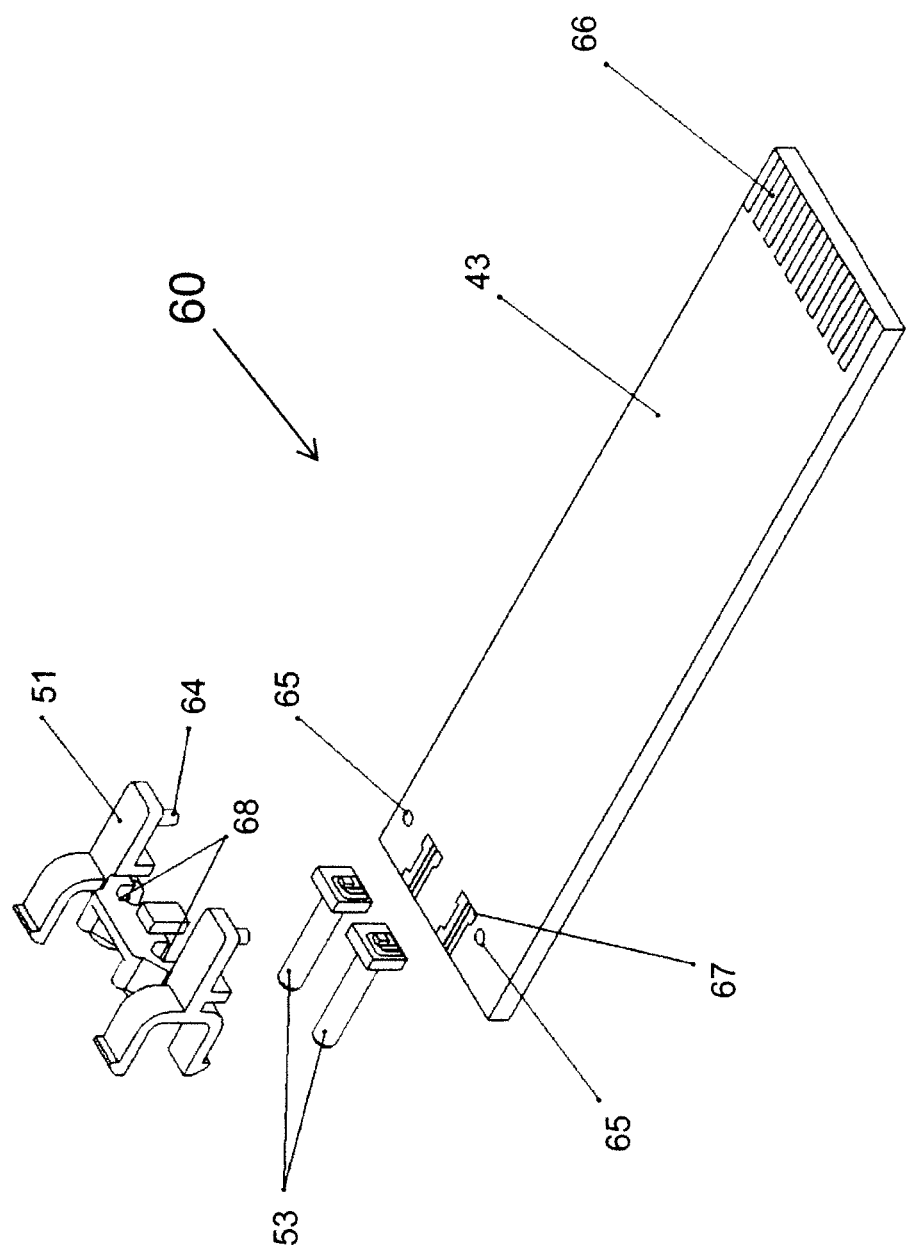
FIG. 6A shows an exploded view of the optoelectronic assembly embodiment with the Ferrule-Pak utilizing silicon board.

FIG. 6A is an exploded view of the optoelectronic assembly 60 of FIG. 6. PC board 43 has location holes 65 to precisely align it to the Ferrule-Pak holder 51 by its location pins 64. It also has traces 67 for electrical contact with Ferrule-Pak 53, contact traces 66 for electrical connection with outside connector (not shown), and other traces and electronic components (not shown). Ferrule-Pak holder 51 holds two Ferrule-Paks 53 in its V-grooves 68 either by glue or by mechanical snap-fit, interference fit or the like. Ferrule-Paks 53 are also electrically connected to the PC board 43 by soldering of the board traces 67 to traces on the silicon board 72 as shown on FIG. 6D.

Figure 6B:
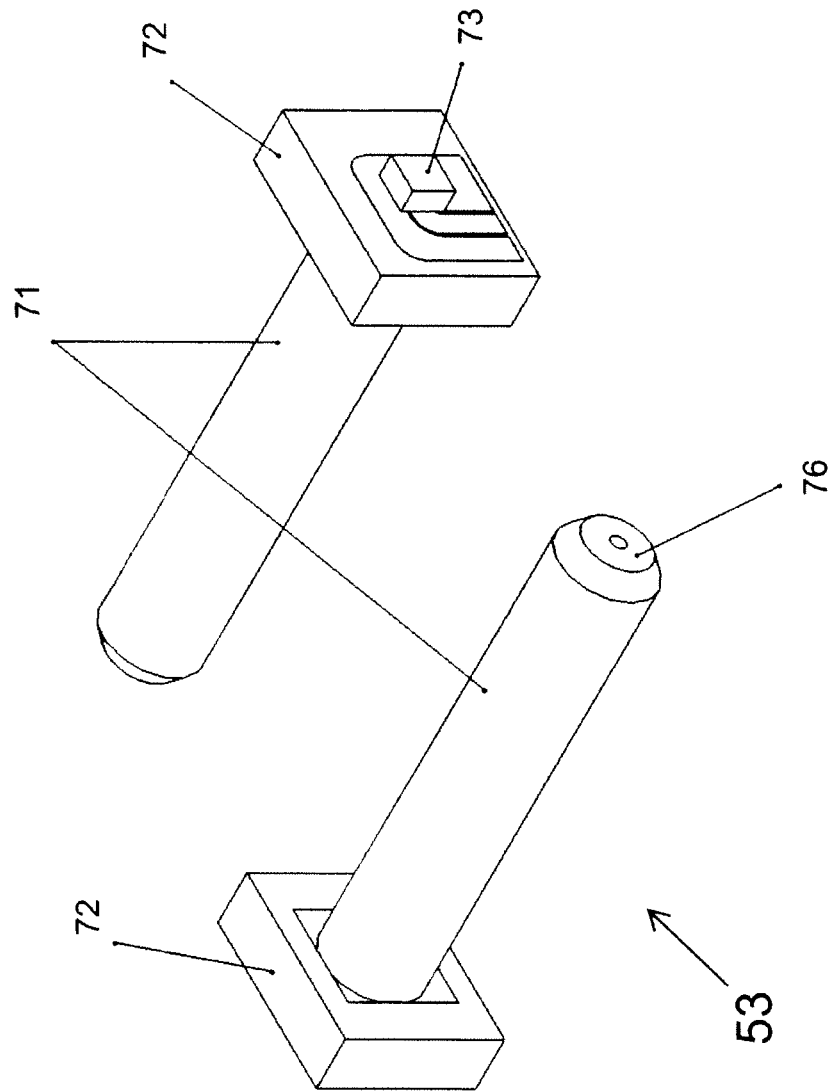
FIG. 6B shows a front and rear view of the Ferrule-Pak utilizing silicon board.

FIG. 6B provides front and rear views of the Ferrule-Pak 53 comprising fiber stub 71, silicon board 72, and photonic device 73.

Figure 6C:
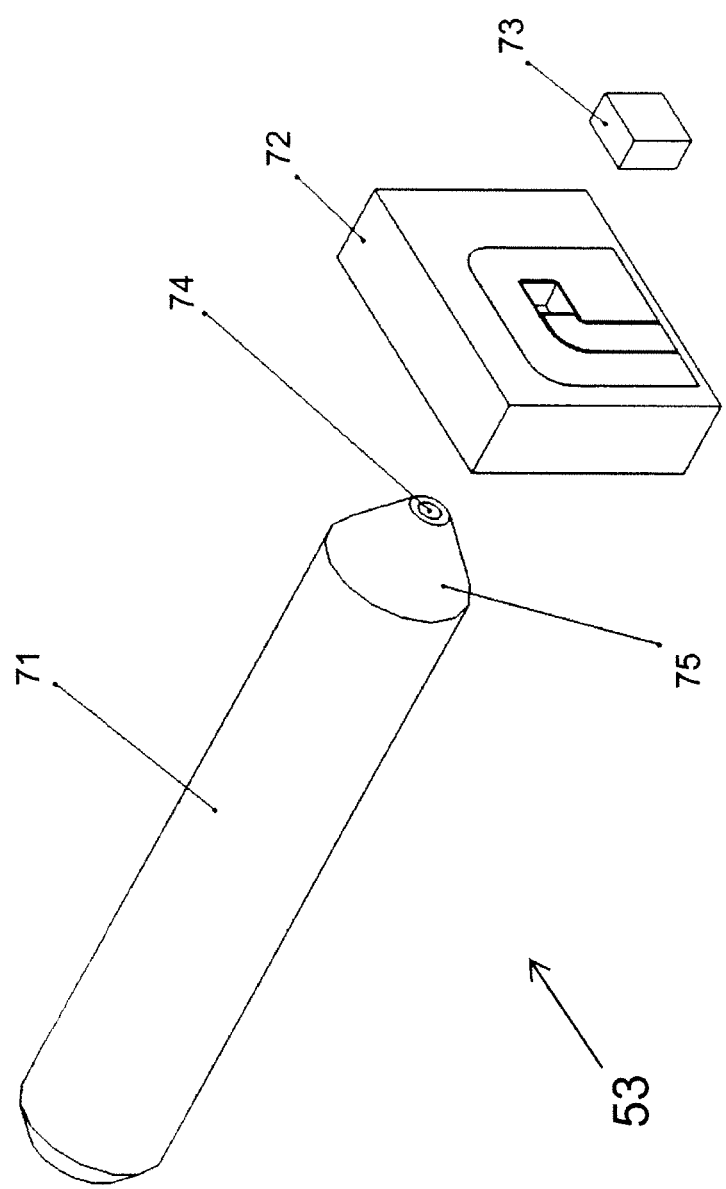
FIG. 6C shows an exploded view of the Ferrule-Pak utilizing silicon board.

FIG. 6C is an exploded view of the Ferrule-Pak 53. Fiber stub 71 is a ceramic ferrule surrounding the multi-mode or single mode fiber 74 depending on the application, running along the length of its interior. Front end 76 (shown on FIG. 6B) of the fiber stub 71 is spherically polished for achieving a good physical contact with incoming connector. In the preferred embodiment, the rear end of the fiber stub 71 is polished flat and has a special precise chamfer 75 with the cone included angle of 70.52° equal to two natural crystal plane angles of the silicon. It has to be understood that while the angles of the stub chamfer and the board angles are equal, angles of the stub chamfer and the board opening other than 70.52 degrees can be used (especially if board material is not of a crystalline structure) and still be within the scope of present invention. The silicon board 72 serves as a board for mounting the photonic device 73 on it and also as an alignment means to precisely and passively align fiber stub 71 and photonic device 73 in order to eliminate the expensive active alignment process.

It has to be understood that the silicon board is described here for illustration purposes only. The material of the board 72 and consequently the cone angle of the fiber stub 71 can vary as long as the board material is electrically non-conductive and has a dielectric constant appropriate for the application. The chamfer on the ferrule, the thickness of the board, and the size and shape of the hole set the distance between the fiber stub 71 end-face and the active surface of the photonic device 73.

FIG. 6D provides front and rear views of the silicon board 72 of FIGS. 6B and 6C. Board 72 has an aperture 77 which serves as a passage way for the optical signal which goes from the photonic device 73 to the fiber stub 71 when the Ferrule-Pak 53 works as a transmitter and in the opposite direction when Ferrule-Pak 53 works as a receiver. Front side of the silicon board 72 has an etched alignment recess in the form of the truncated pyramid 78. As was mentioned above this pyramid 78 serves as an alignment means to passively align the fiber stub 71 and the photonic device 73. The height of the pyramid 78 is calculated in such a way that the distance between the end of the fiber stub 71 and the photonic device 73 can be controlled depending on the type of the fiber and the type of the photonic device 73. The rear surface of the silicon board 72 has electrical traces 79 and 80 to electrically connect photonic device 73 to the PC board 43 of FIGS. 6 and 6A. Trace 79 is a signal contact and trace 80 is a ground. It has to be understood that the configuration, number, and type of those traces and electronic elements other than the photonic device can be different depending on the application and still be in the scope of the present invention.

FIGS. 7A-7D show the second embodiment 90 of the invention including the PC board subassembly 91 with the different Ferrule-Pak holder 92 operably attached to PC board 91 mechanically and connected electrically. The Ferrule-Pak holder 92 contains two different (compare to Ferrule-Paks 53 of the FIGS. 6, 6A, and 6B) Ferrule-Paks 93. Ferrule-Paks 93 of FIG. 7 can be both: transmitters such as VCSELs or other Lasers, receivers such as detectors, or a combination of each, so as to form a transceiver.

Figure 7:
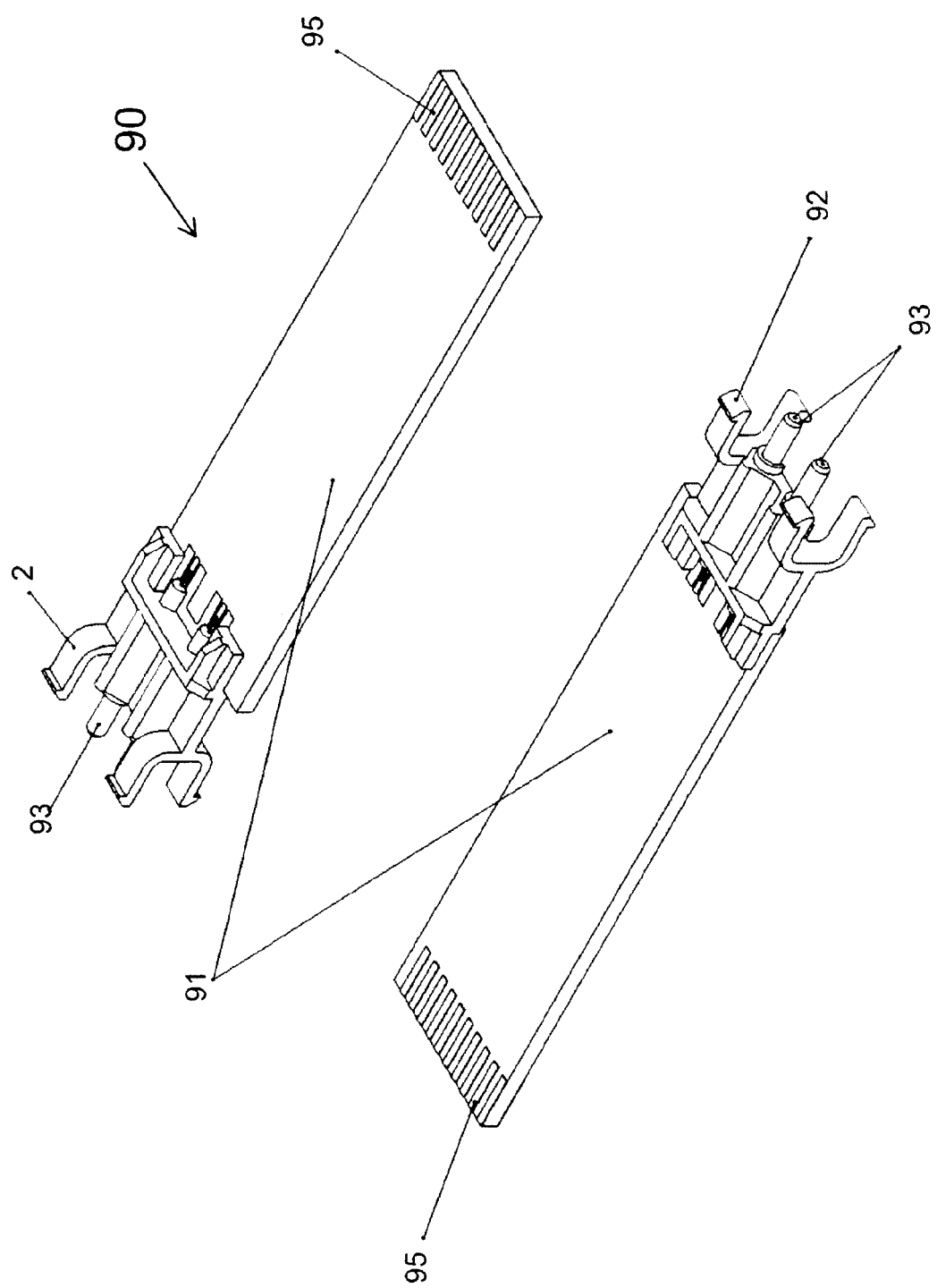
FIG. 7 shows a front and rear view of the optoelectronic assembly embodiment with the Ferrule-Pak utilizing RF coaxial conductor.
Figure 7A:
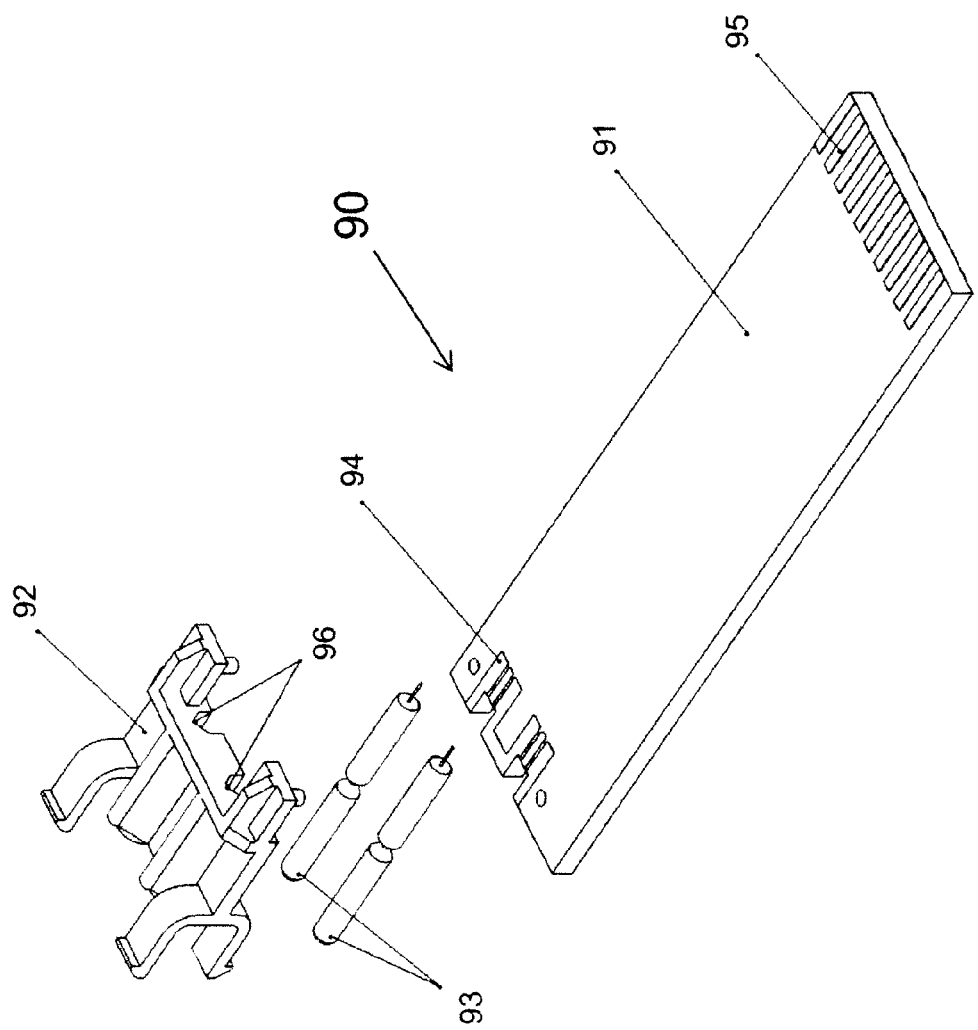
FIG. 7A shows an exploded view of the optoelectronic assembly embodiment with the Ferrule-Pak utilizing RF coaxial conductor.

FIG. 7A is an exploded view of that optoelectronic assembly 90 of FIG. 7. PC board 91 has location holes and Ferrule-Pak 93 has compatible location pins to precisely align Ferrule-Pak holder 92 and PC board 91 in a way similar to the one shown in FIG. 6A. PC board 91 also has traces 94 for electrical contact with Ferrule-Paks 93, contact traces 95 for electrical connection with outside connector, and other traces and electronic components (not shown). Ferrule-Pak holder 92 holds two Ferrule-Paks 93 in its V-grooves 96 either by glue, by mechanical snap-fit, interference-fit, or the like. Ferrule-Paks 93 are also electrically connected to the PC board 91 by soldering of the board traces 94 to the metalized ceramic holder 97 shown on FIG. 7B.

Figure 7B:
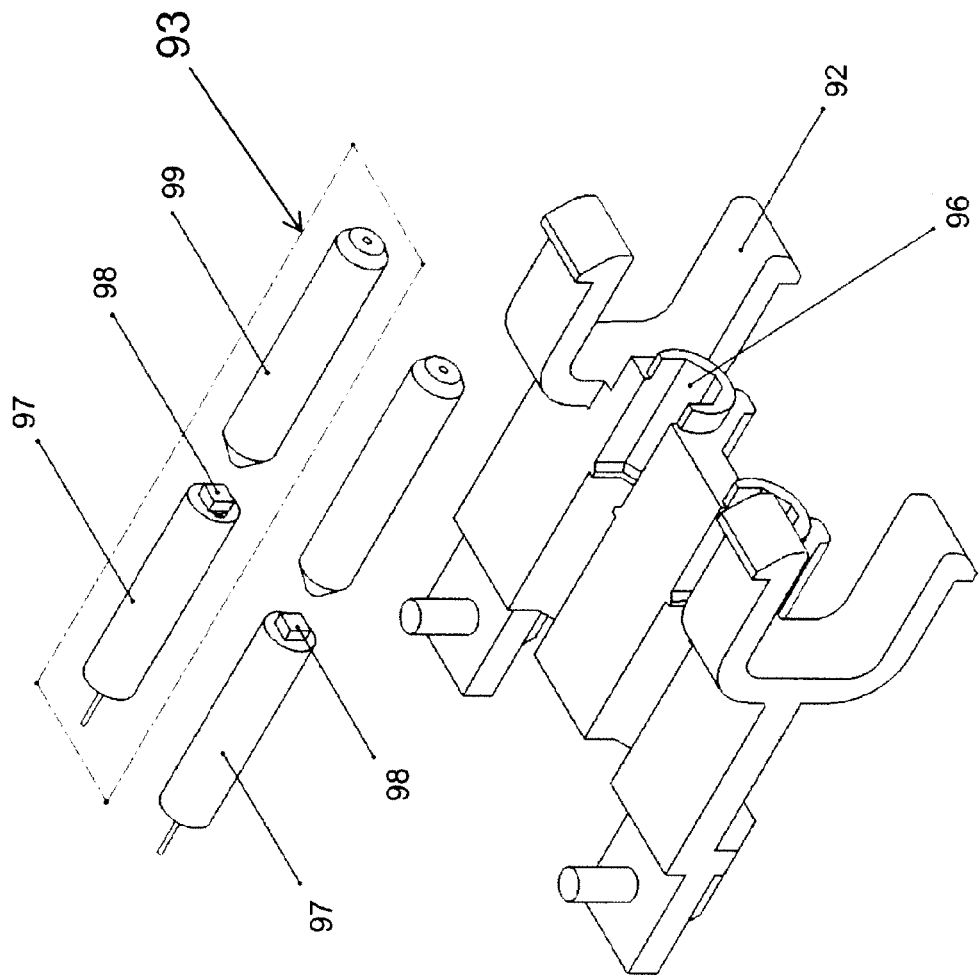
FIG. 7B shows an exploded upside down view of the holder of the Ferrule-Pak utilizing RF coaxial conductor

FIG. 7B is an exploded and turned upside-down view of the Ferrule-Pak holder 92 and Ferrule-Pak package 93 of FIG. 7A. Ferrule-Pack package 93 consists of two parts. First part is a metalized ceramic holder 97 for holding the photonic device 98 and a RF conductor. Second part is a fiber stub 99. Both parts of the Ferrule-Pack package 93 are axially aligned and glued in the V-groove 96 of the holder 92. Axial distance between the photonic device 98 and the fiber stub 99 is calculated and depends on application. This distance is fixed during the assembly process.

Figure 7C:
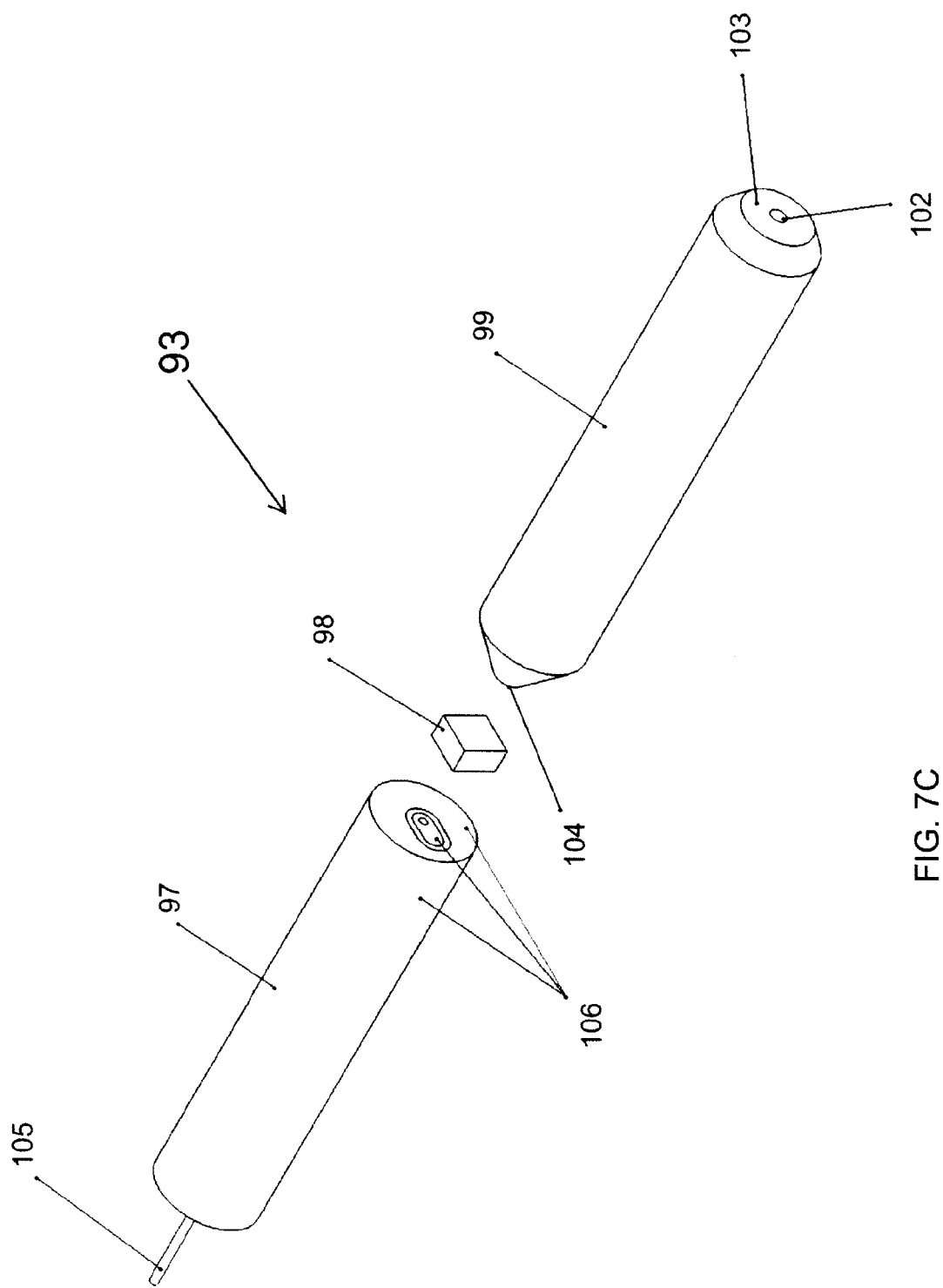
FIG. 7C shows an exploded view of the Ferrule-Pak package utilizing RF coaxial conductor

FIG. 7C is an exploded and enlarged view of the Ferrule-Pak package 93 of FIG. 7B. Fiber stub 99 is a ceramic ferrule with the multimode or single mode fiber 102 glued inside of it. Front end 103 of the fiber stub 99 is spherically polished for achieving a good physical contact with the ferrule of an incoming connector (not shown). The rear end 104 of the fiber stub 99 is polished flat or at the appropriate angle depending on the application. Metalized ceramic holder 97 serves as a holder for the photonic device 98 and also as a coaxial insulator for central conductor 105. Surfaces 106 of the holder 97 are metalized to achieve electrical contacts with photonic device 98 and central conductor 105. Electrical properties of the holder 97 material, metallization parameters, and diameter and material of the conductor 105 depend on the application and are designed to achieve appropriate impedance.

The durability of optoelectronic devices is typically limited by the photonic devices, which tend to be delicate devices that are adversely affected by elements such as dust, moisture, PCB mounting flux residue, cleaning residue and physical handling. Hence, depending on the application photonic devices can be either: hermetically sealed; quasi-hermetically sealed; or, non-hermetic.

Figure 7D:
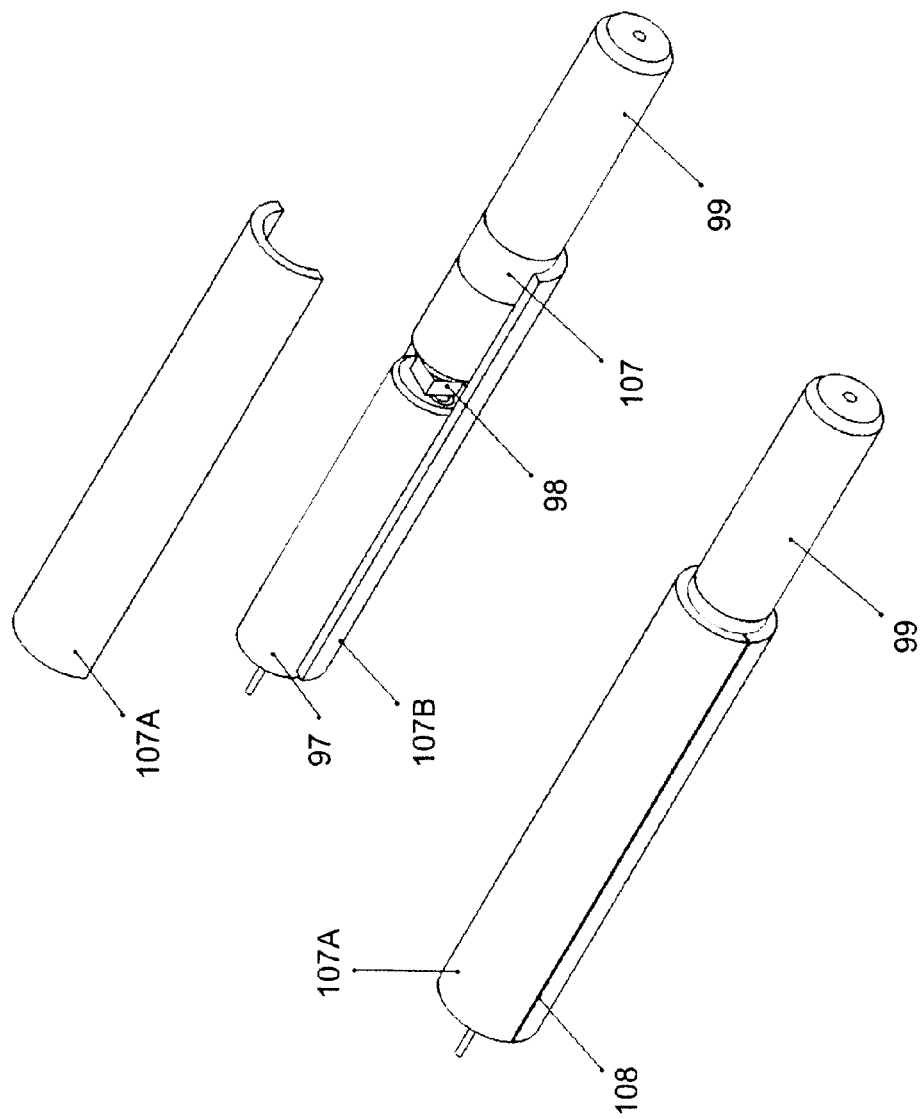
FIG. 7D shows a general and partially exploded view of the hermetic version of the Ferrule-Pak package.

A Ferrule-Pak package 93 of FIGS. 7A and 7B shown in FIG. 7D in closed and open position is designed for hermetic application. Fiber stub 99 has a metal ring 107 which may be deposited around its diameter for soldering purposes. The fiber stub 99 and the metalized ceramic holder 97 are enclosed between two semi-cylindrical shells 107A, 107B. After maintaining the proper axial distance between fiber stub 99 and metalized holder 97 they are covered by shells 107A, 107B and those shells are soldered or welded to metalized surfaces of both elements 97 and 99 and to each other along the lines 108 (second line 108 is invisible). Joining techniques such as soldering or welding forms a seal that serves as a hermetic barrier.

While all of the examples of the invention described herein use a ferrule diameter that is less than one millimeter, the invention likewise includes application of the principles thereof to ferrule diameters over one millimeter. Among other things, the present invention has the advantage of avoiding the need to use TO cans to contain the photonic devices.

What is claimed:

1. An active modular optoelectronic interface including a transmitter module, a receiver module or a combination thereof, said interface having a miniature size, said interface comprising:
   an assembly comprising:
      a fiber stub having a first end and a second end;
      a photonic device; and
      a substrate upon which the photonic device is operably coupled at a first side of said substrate;
   an optical fiber spanning the longitudinal interior of the fiber stub from said first end to said second end thereof for conducting an optical signal therethrough;
      said substrate operably attached to said second end of said fiber stub;
      alignment means operably interposed between said second end of said fiber stub and a second side of said substrate for operatively and passively aligning said optical fiber of said fiber stub with said photonic device so as to transmit said optical signal from one to the other without the use of a lens;
   said alignment means comprising:
      said substrate having a substantially pyramidal shaped opening formed therein; and
      an alignment cone disposed at one end of said fiber stub for receipt by said substantially pyramidal shaped opening in said substrate.

2. An active modular optoelectronic device for use with a push-release mechanism for receiving a connector comprising:
   a half adapter having an opening at a first end;
   said half adapter further having said push-release mechanism for operably connecting and releasing a connector from said half-adapter opening;
   an alignment sleeve holder operably connected at a first end thereof to said half adapter at a second end of said half adapter;
   a printed circuit board operably associated with said alignment sleeve holder at the opposite end thereof;
   an assembly comprising a fiber stub, a photonic device and said printed circuit board upon which the photonic device is operably coupled;
   at least one holder for said fiber stub operably connected to said printed circuit board; and, at least one photonic device further being operably connected to the fiber stub holder;

said fiber stub holder comprising passive alignment means operably associated therewith between said fiber stub and said photonic device.

3. The optoelectronic device of claim 2 further comprising: said fiber stub;

a board operably connected to one end of said fiber stub;

an optical fiber spanning the longitudinal interior of said fiber stub from one end to the opposite end thereof;

a photonic device operably connected to said board; and, said passive alignment means on the fiber stub and the board aligning said photonic device to said optical fiber.

4. The optoelectronic device of claim 3 wherein said passive alignment means comprises:

the board having a substantially pyramid shaped opening formed therein; and, an alignment cone manufactured onto one end of the fiber stub for receipt by the pyramid shaped opening in the board.

5. The optoelectronic device of claim 3 wherein said passive alignment means comprises:

said board having a substantially conically shaped opening formed therein; and, an alignment cone formed onto one end of the fiber stub.

6. The optoelectronic device of claim 5 further comprising:

at least one electrical trace placed on said board; and, said board having an aperture passing therethrough.

7. The optoelectronic device of claim 3 further comprising:

at least one electrical trace placed on the printed circuit board;

said fiber stub holder securely holding at least one fiber stub and operably electrically connecting said fiber stub to said trace on said printed circuit board; and, said printed circuit board having at least one alignment hole formed therein for receipt of at least one alignment pin on the fiber stub holder.

8. An active modular optoelectronic device for use with a push-release mechanism for receiving a connector comprising:

a half adapter having an opening at a first end;

said half adapter further having said push-release mechanism for operably connecting and releasing a connector from said half-adapter opening;

an alignment sleeve holder operably connected at a first end thereof to said half adapter at a second end of said half adapter;

a printed circuit board operably associated with said alignment sleeve holder at the opposite end thereof;

at least one fiber stub having an optical fiber spanning the longitudinal interior thereof from one end to the other thereof;

at least one fiber stub holder operably connected to said printed circuit board; and, at least one fiber stub operably connected to the fiber stub holder;

said fiber stub holder further comprising:

a metalized ceramic holder;

an RF conductor designed for a specific impedance operably carried by said ceramic holder;

a photonic device operably connected to said ceramic holder; and, passive alignment means on the fiber stub and the board aligning said photonic device to said optical fiber;

wherein said fiber stub holder comprising:

at least one V-groove holding the fiber stub;

at least one location pin; and, said printed circuit board having at least one hole receiving said location pin.

9. The optoelectronic device of claim 8 further comprising:

a metalized area for soldering;

a pair of semi-cylindrical metal shells;

and a soldering area.

10. An active modular optoelectronic device for use with a mechanical interface for receiving a connector comprising:

a half adapter having an opening at a first end;

said half adapter further having said mechanical interface for operably connecting and releasing a connector from said half-adapter opening;

an alignment sleeve holder operably connected at a first end thereof to said half adapter at a second end of said half adapter;

a printed circuit board operably associated with said alignment sleeve holder at the opposite end thereof;

at least one fiber stub holder operably connected to said printed circuit board; and, at least one fiber stub comprising a photonic device and further being operably connected to the fiber stub holder, wherein said fiber stub comprises passive alignment means between said fiber and said photonic device.

11. The optoelectronic device of claim 10 further comprising:

a fiber stub;

a board operably connected to one end of said fiber stub;

an optical fiber spanning the longitudinal interior of said fiber stub from one end to the opposite end thereof;

said photonic device operably connected to said board; and, said passive alignment means on the fiber stub and the board aligning said photonic device to said optical fiber.

* * * * *